United States Patent
La Rosa

(10) Patent No.: US 10,218,336 B2
(45) Date of Patent: Feb. 26, 2019

(54) RING OSCILLATOR OPERATION MANAGEMENT METHOD AND APPARATUS

(71) Applicant: STMicroelectronics (Rousset) SAS, Rousset (FR)

(72) Inventor: Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 195 days.

(21) Appl. No.: 15/436,817

(22) Filed: Feb. 19, 2017

(65) Prior Publication Data

US 2018/0091094 A1    Mar. 29, 2018

(30) Foreign Application Priority Data

Sep. 23, 2016    (FR) .................... 16 58937

(51) Int. Cl.
| | |
|---|---|
| *H03L 7/099* | (2006.01) |
| *H03L 5/00* | (2006.01) |
| *G05F 3/26* | (2006.01) |
| *H03K 3/03* | (2006.01) |
| *H03K 3/011* | (2006.01) |
| *G11C 7/06* | (2006.01) |
| *H03L 1/00* | (2006.01) |

(52) U.S. Cl.
CPC .......... *H03K 3/0315* (2013.01); *G05F 3/262* (2013.01); *G11C 7/062* (2013.01); *H03K 3/011* (2013.01); *H03L 1/00* (2013.01); *H03L 5/00* (2013.01); *H03L 7/0995* (2013.01)

(58) Field of Classification Search
CPC .. H03K 3/0315; H03K 3/0322; H03L 7/0995; H03L 5/00; H03L 5/02; G05F 3/26; G05F 3/262

See application file for complete search history.

(56) References Cited

U.S. PATENT DOCUMENTS

| | | | |
|---|---|---|---|
| 6,788,161 B2 * | 9/2004 | Vilander | H03B 5/04 331/175 |
| 7,852,168 B1 * | 12/2010 | Song | H03L 7/099 331/177 R |
| 2012/0256693 A1 | 10/2012 | Raghunathan et al. | |
| 2013/0093526 A1 | 4/2013 | Ravinuthula | |

* cited by examiner

*Primary Examiner* — Ryan Johnson
(74) *Attorney, Agent, or Firm* — Slater Matsil, LLP

(57) ABSTRACT

A device and method can be used to manage the operation of a ring oscillator circuit. A master oscillator circuit generates a master supply voltage. The master supply voltage associated with a stable oscillation rate of the master oscillator circuit. The master oscillator circuit is supplied with current and is structurally identical to the ring oscillator circuit. A capacitive circuit is loaded with a load voltage originating from the master supply voltage. In response to a control signal, the ring oscillator circuit is supplied with a current controlled by a voltage delivered by the capacitive circuit, in such a way as to provide a stable oscillation rate for the ring oscillator circuit.

21 Claims, 6 Drawing Sheets

RING OSCILLATOR OPERATION MANAGEMENT METHOD AND APPARATUS

CROSS-REFERENCE TO RELATED APPLICATIONS

This application priority to French Patent Application No. 1658937, filed on Sep. 23, 2016, which application is hereby incorporated herein by reference.

TECHNICAL FIELD

Embodiments of the invention relate to electronic circuits, in particular, the management of the operation of ring oscillators, for example, for non-volatile memory read amplifiers.

BACKGROUND

Non-volatile memories normally comprise a memory plane equipped with memory cells capable of storing data.

The reading of the data stored in the memory plane is performed by a read amplifier, operating at the rate of a clock signal, usually generated by an analogue oscillator circuit.

Memories are increasingly dense, operating frequencies increase, and energy consumption is minimized.

Consequently, the generation of the clock signal is subject to increasingly stringent reliability, precision and performance constraints.

Different types of oscillator circuits furthermore exist, such as, for example, ring oscillator circuits.

Although a ring oscillator is generally simple to implement, it is generally little used for generating a clock signal. In fact, it is relatively unstable, for example in response to variations due to manufacturing methods.

Moreover, ring oscillators generally require a stabilization time before supplying a stable oscillating signal, thereby delaying the start, the restart or a synchronization of the oscillating signal.

SUMMARY

According to embodiments, a method and a device are proposed for managing the operation of at least one ring oscillator circuit, yielding a generation of a reliable, precise, effective and energy-saving clock signal.

According to one aspect, a method is proposed for managing the operation of at least one ring oscillator circuit. Initialization step includes generation, by a master oscillator circuit supplied with current and structurally identical to the at least one ring oscillator, of a master supply voltage of this master oscillator associated with a stable oscillation rate of this master oscillator circuit, and a loading of a capacitive circuit with a load voltage originating from the master supply voltage. An operating step includes, in response to a control signal, a supplying with current of the at least one ring oscillator circuit controlled by the voltage delivered by the capacitive circuit, in such a way as to provide a stable oscillation rate for the at least one ring oscillator circuit.

The master oscillator circuit being supplied with current, a "fictitious" master supply voltage will be evident on its supply terminal, and this voltage, associated with a stable oscillation rate of the master oscillator circuit, will provide the at least one ring oscillator with this stable oscillation rate due to the identical structure of the oscillator circuits.

The capacitive circuit allows the storage of the load voltage obtained from the stabilization of the master oscillator circuit, the voltage controlling the delivery of a current providing a stable oscillating rate for the at least one ring oscillator.

Thus, in response to a control signal, for example a start, restart or synchronization signal, the at least one ring oscillator circuit is immediately fed by a current providing it with a stable oscillation rate. The starts, restarts and synchronization of the at least one ring oscillator circuit consequently dispense with the normally required and inconvenient stabilization time.

Until the master supply voltage is reached, the initialization step advantageously includes an adjustment of the current supply of the master oscillator circuit and of the at least one ring oscillator circuit, the current supply of the at least one ring oscillator circuit furthermore being controlled by the current supply voltage of the master oscillator circuit.

This compensates, in particular, for the instabilities due to fluctuations in production methods, for example so that the master supply voltage offers the desired stable oscillation rate to the at least one ring oscillator circuit.

According to one embodiment, the initialization step is periodically reproduced, advantageously when the at least one ring oscillator is in operation.

According to a different aspect, a device is proposed for managing the operation of at least one ring oscillator circuit. A master oscillator circuit is structurally identical to the at least one ring oscillator circuit. A first controllable current supply circuit and at least a second controllable current supply circuit Configured to Supply the master oscillator circuit and the at least one ring oscillator circuit respectively. A controllable capacitive circuit has a first configuration in which it is configured to be loaded at a load voltage originating from a master supply voltage of the master oscillator circuit associated with a stable oscillation rate of this master oscillator circuit, and a second configuration in which it is configured to be disconnected from the first supply circuit and to deliver a voltage. A controller is configured so that, during an initialization step, the first current supply circuit is placed in a configuration supplying current to the master oscillator circuit until it generates the master supply voltage, and the capacitive circuit is placed in its first configuration. During an operating step, the controller places the capacitive circuit in its second configuration and the at least a second current supply circuit in a configuration feeding the at least one ring oscillator circuit with a current controlled by the voltage delivered by the capacitive circuit in such a way as to provide a stable oscillation rate for the at least one ring oscillator circuit.

According to one embodiment, the controller comprises a control circuit and a load switch controlled by the control circuit, and the capacitive circuit comprises a capacitor connected between a cold point and, via the load switch, an anode of a diode connected to the first current supply circuit, the control circuit being configured to close the load switch in the initialization step, the capacitive circuit then being in its first configuration, and to open the load switch in the operating step, the capacitive circuit then being in its second configuration.

In its second configuration, the capacitive circuit is electrically isolated from the voltage sources of the device, thus limiting, in particular, the external influences on the load voltage, such as current leakages on transistor conduction terminals, for example, and maintaining the load voltage at a value providing a stable oscillation rate.

The controller is advantageously configured so that, during the operating step, it places the capacitive circuit alternately in its first configuration and in its second configuration, in such a way that it refreshes the value of the load voltage.

According to one embodiment that is advantageous in terms of compensating for the operating fluctuations of the device, due, in particular, to manufacturing methods, the controller comprises a control circuit and first power switches, the first current supply circuit includes a voltage source and a current-mirror assembly having a plurality of first copy transistors in parallel configured to copy the same reference current and connected to the voltage source via the respective first power switches, and the control circuit is configured so that, during the initialization step, it closes at least some of the first power switches in such a way as to adjust the current feeding the master oscillator circuit to provide it with the stable oscillation rate.

Also, according to one embodiment that is advantageous in terms of compensating for the operating fluctuations of the device, the controller comprises a control circuit and second power switches, the second current supply circuit includes a voltage source and a current-mirror assembly having a plurality of second copy transistors in parallel, connected to the capacitive circuit on their control terminals and connected to the voltage source via the respective second power switches, and the control circuit is configured so that, during the initialization step and until the master supply voltage associated with the stable rate is reached, it closes the second power switches in such a way as to adjust the current supply of the at least one ring oscillator circuit.

According to one embodiment, the controller is configured to control periodically an implementation of the initialization step, advantageously when the at least one ring oscillator is in operation.

An integrated non-volatile memory system including, in particular, a read amplifier and at least one ring oscillator circuit configured to supply the read amplifier with a clock signal may advantageously include a device for managing the operation of the at least one ring oscillator circuit, as defined above.

An electronic apparatus, such as an on-board computer of a vehicle, a mobile telephone or a personal computer may advantageously comprise a non-volatile memory system of this type.

BRIEF DESCRIPTION OF THE DRAWINGS

Other advantages and characteristics of the invention will become evident from a detailed examination of embodiments, in no way limiting, and the attached drawings, in which.

DETAILED DESCRIPTION OF ILLUSTRATIVE EMBODIMENTS

Figure 1:
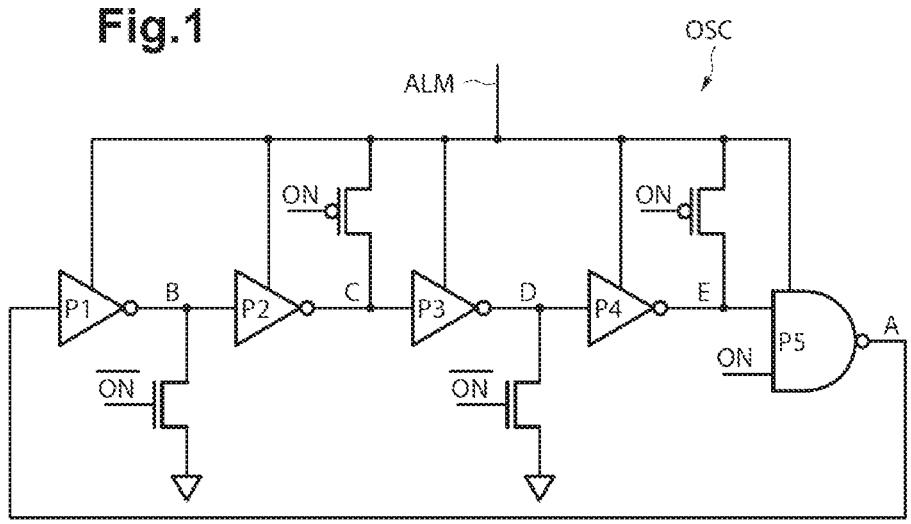
FIG. 1 shows an example of a ring oscillator circuit.

FIG. 1 shows an example of a ring oscillator circuit OSC, conventionally comprising an odd number of inverters P1-P5 connected in series in a closed loop, supplied with voltage on a supply terminal ALM, the operation of which is controlled by a signal ON.

Oscillations are produced on the outputs A-E of the inverters and originate from the switching time of an inverter P1-P5, and therefore from the voltage present on the supply terminal ALM.

The oscillations may be used, for example, to generate a clock signal, for example by a state machine harmonizing the different clock signals of an electronic device such as an integrated circuit.

Figure 2:
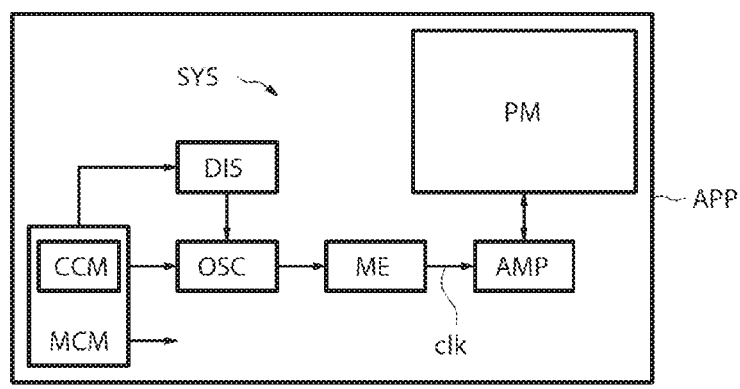
FIG. 2 shows schematically an apparatus comprising a device according to the invention.

FIG. 2 shows schematically an electronic apparatus APP, such as an on-board computer of a vehicle, a mobile telephone or a personal computer comprising an integrated non-volatile memory system SYS.

The system SYS includes, in particular, a memory plane PM, a read amplifier AMP, a ring oscillator circuit OSC, a device DIS for managing the operation of the ring oscillator circuit OSC, and controller MCM.

The ring oscillator circuit OSC supplies the read amplifier AMP with a regular clock signal clk timing the operations of reading data in the memory plane PM of the read amplifier AMP, normally via a state machine ME.

The oscillator circuit OSC is controlled by the device DIS.

The controller MCM comprise a control circuit CCM configured to generate control signals, in particular for the device DIS and the oscillator circuit OSC.

The control circuit CCM is implemented, for example, by programmable logic circuits.

The control signals may serve, for example, to control a closing and an opening of controllable switches forming part of the controller MCM, or may, for example, be the signal ON controlling the operation of an oscillator circuit of the type described in relation to FIG. 1.

Figure 3:
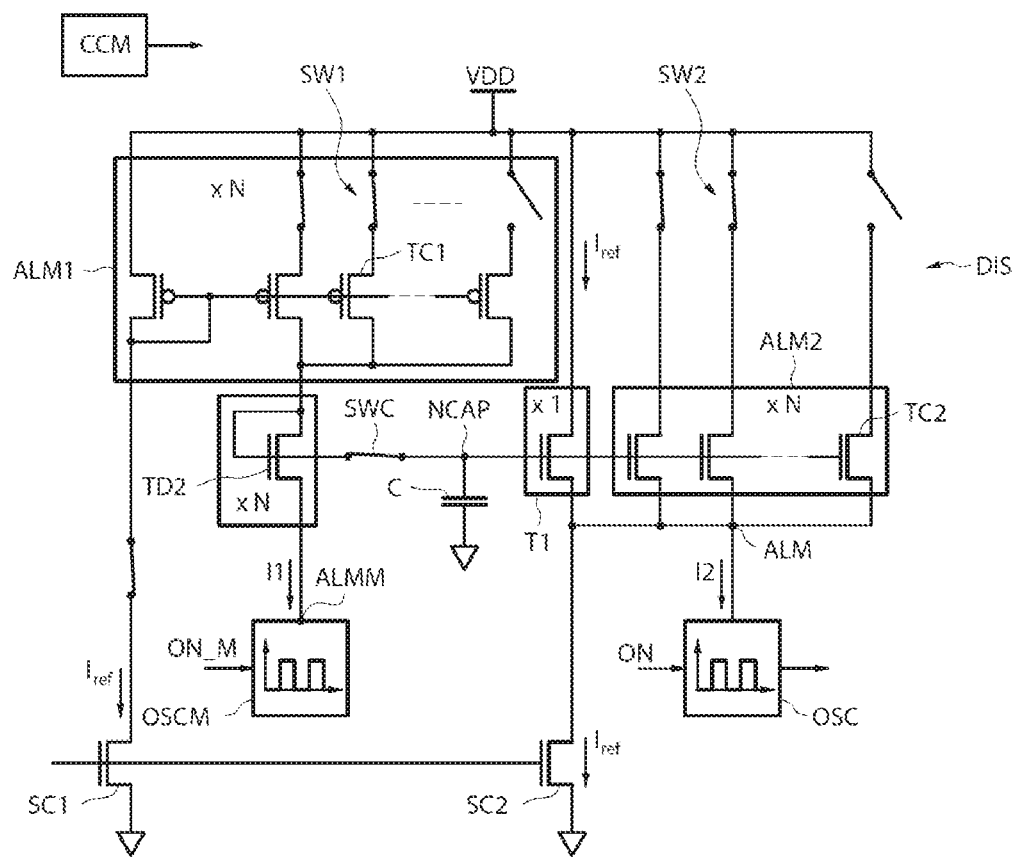
FIGS. 3 to 7 show a device for managing the operation of at least one ring oscillator circuit in different configurations.

FIG. 3 shows a device DIS for managing the operation of a ring oscillator circuit OSC, for example of the type described in relation to FIG. 1.

The device DIS comprises a master oscillator OSCM having a structure identical to the ring oscillator circuit OSC.

The master oscillator circuit OSCM is fed by a first current supply circuit ALM1, supplying a first current I1 on the supply terminal ALMM of the master oscillator circuit OSCM.

The first current I1 originates here from a current-mirror assembly having a plurality of N copy transistors TC1 in parallel, copying the same reference current Iref, generated by a first invariable current source SC1.

N is a whole number, for example, between 10 and 30.

The N copy transistors TC1 are connected to a voltage source VDD via as many respective controllable first power switches SW1.

The first switches SW1 form control elements included in the controller MCM and are controlled by a signal generated by the control circuit CCM.

Thus, the current I1 generated by the first supply circuit ALM1 has an intensity N*Iref-D1, D1 corresponding to a differential derived from the number of first switches SW1 closed or opened by the control circuit CCM.

The closure or non-closure of the first switches SW1 compensates, in particular, for the instabilities due, for example, to the fluctuations in manufacturing methods, by adjusting the value of the differential D1 and therefore the current I1 feeding the master oscillator circuit OSCM.

The number of open first switches SW1 is advantageously chosen according to the conditions of use of the device.

The device DIS furthermore comprises a second current-generating circuits ALM2, supplying a second current I2 to the ring oscillator circuit OSC.

The current I2 is generated by a plurality of N current-mirror assemblies, in parallel.

More precisely, N copy transistors TC2 in parallel copy the current passing through N diode-connected and parallel-connected transistors TD2.

The diode-connected transistors TD2 are connected between the first current supply circuit ALM1 and the supply terminal ALMM of the master oscillator circuit OSCM and carry the current I1.

The N copy transistors TC2 are also connected on a conduction terminal to a voltage source VDD via as many respective second controllable power switches SW2, controlled by a signal generated by the control circuit CCM.

The second power switches SW2 also form control elements included in the controller MCM.

Thus, the value of the current I2 is equal to N*Iref-D2, D2 corresponding to a differential derived from the differential D1 and from the number of seconds switches SW2 closed or opened by the control circuit CCM.

The closure or non-closure of the second switches SW2 also compensates, in particular, for the instabilities due, for example, to the fluctuations in manufacturing methods, by adjusting the value of the differential D2 and therefore of the current I2 feeding the ring oscillator circuit OSC.

Similarly, the number of open second switches SW2 is advantageously chosen according to the conditions of use of the device.

Furthermore, a capacitive circuit comprising a capacitor C is connected between a cold point, for example an earth terminal, and a node NCAP located between the gates of the N copy transistors TC2 and the gates of the N diode-connected transistors TD2.

A controllable load switch SWC controlled by a signal generated by the control circuit CCM electrically connects the node NCAP to the gates of the N diode-connected transistors TD2 or to the anodes of the equivalent diodes, or isolates it from them.

Similarly, the load switch SWC forms a control element included in the controller MCM.

Furthermore, a current source SC2 draws the reference current Iref on the supply terminal ALM of the ring oscillator circuit OSC.

The supply terminal ALM is furthermore connected to a conduction terminal of a transistor T1, the other conduction terminal of which is connected to the voltage source VDD, the control terminal of which is connected to the node NCAP.

Different advantageous implementations of this embodiment of a device DIS for managing the operation of the ring oscillator circuit OSC will be described below, in relation to the attached figures.

FIG. 3 shows a step of initialization of the device DIS during which a master supply voltage associated with a stable oscillation rate of the master oscillator circuit will be generated.

During this step, the current supply circuits ALM1 and ALM2 generate the respective currents I1 and I2 on the respective voltage supply terminals ALMM, ALM of the master oscillator circuit OSCM and of the ring oscillator circuit OSC.

The switch SWC is closed. The load potential present on the node NCAP is thus at the current potential present on the gates of the N diode-connected and parallel-connected transistors TD2.

This current potential is equal to the current potential present on the supply terminal ALMM of the master oscillator circuit OSCM increased by the threshold voltage of an equivalent diode TD2.

The load voltage is thus determined by the current voltage present on the supply terminal ALMM of the master oscillator circuit OSCM.

The master oscillator circuit OSCM being structurally configured to be supplied with voltage, the application of a current on the supply terminal ALMM results in a balancing of the voltages and currents involved in the components of the master oscillator circuit OSCM, thus generating a master supply voltage on the supply terminal ALMM.

Due to its current-mirror configuration, and the fact that the two oscillators have the same voltage/current characteristics, the second current-generating circuit ALM2 delivers on the supply terminal ALM of the ring oscillator circuit OSC a current I2 equal to the current I1.

Similarly to the master oscillator circuit OSCM, the application of a current on the supply terminal of the ring oscillator circuit OSC results in a balancing of the voltages and currents involved in the circuit, generating a supply voltage on the supply terminal ALM of the ring oscillator circuit OSC.

As a result of the identical nature of the currents I1 and I2 and the identical structure of the master oscillator circuit OSCM and the ring oscillator circuit OSC, the voltage present on the supply terminal ALM of the ring oscillator circuit is the same as the master supply voltage.

Thus, when the master oscillator circuit OSCM achieves a stable oscillation rate, the master supply voltage, then associated with the stable oscillation rate of the master oscillator circuit, occurs directly on the supply terminal ALM of the ring oscillator circuit OSC, via the generation of the current I2, offering a stable oscillation rate to the ring oscillator circuit OSC.

Moreover, during the initialization step, the first and second power switches SW1, SW2 allow adjustment of the oscillation rates of the oscillator circuits OSCM, OSC, for example to a given frequency, and compensation for the different physical fluctuations previously introduced.

Figure 4:
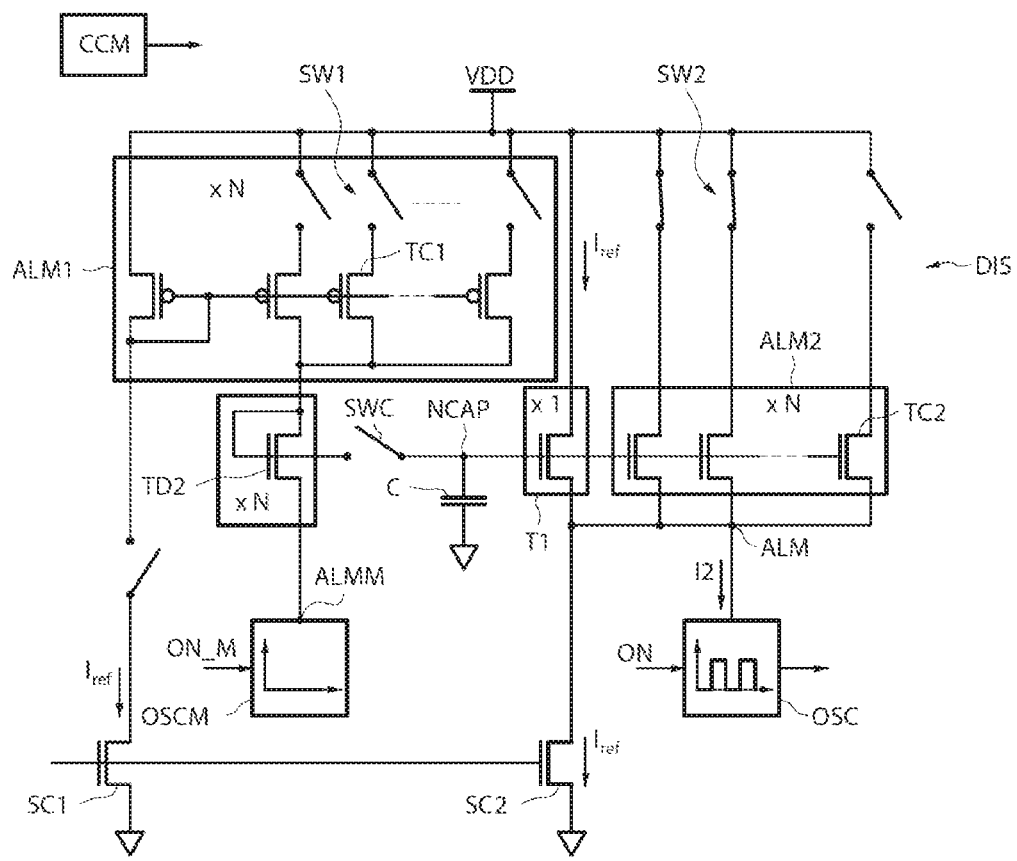

FIG. 4 shows the embodiment of the device DIS for managing the operation of a ring oscillator in a configuration corresponding to an operating step.

The operating step follows the initialization step, after the master supply voltage associated with a stable oscillation rate is reached.

As previously described, the master supply voltage determines the load voltage present on the node NCAP which controls the current supply I2 generated by the second supply circuit ALM2.

The power switch SWC being closed during the initialization step, the capacitor C has been loaded at a load voltage originating from the master supply voltage associated with a stable oscillation rate.

More precisely, the load voltage is the same voltage as the voltage controlling the generation by a current mirror of a current I2 copying the current I1 flowing in the master oscillator circuit OSCM with a stable oscillation rate.

The capacitor C therefore delivers the load voltage on the node NCAP, the load voltage controlling the flow of a current I2 immediately providing a stable oscillation rate for the ring oscillator circuit OSC.

In the operating step, all the first power switches SW1 of the first current-generating circuit ALM1 are open, allowing a substantial energy saving.

Furthermore, the load switch SWC is open and therefore the node NCAP, connected to an electrode of the capacitor C and to the gates of the copy transistors of the second current-generating circuit ALM2, is electrically isolated from the fixed voltage sources, such as the hot points, for example the terminal VDD, and the cold points of the device DIS.

The node NCAP is thus set to a floating potential having the value of the load voltage.

This configuration advantageously avoids the risks of leakages and the influence of the voltage sources and thus maintains the load voltage on the node NCAP for as long as possible, for example for a duration in the region of one hundred microseconds.

The ring oscillator circuit OSC is in turn fed in the normal manner by the current I2 providing it with a stable oscillation rate, the second switches SW2 being closed in response to a control signal emitted by the control circuit CCM.

The control signal may, for example, be a start, restart or synchronization signal of the ring oscillator circuit OSC.

In summary, the device supplies the ring oscillator circuit with a current providing it immediately with a stable oscillation rate, for example in response to a start, restart or synchronization signal, in particular due to the storage on the node NCAP of a load voltage specifically controlling this current.

Figure 5:
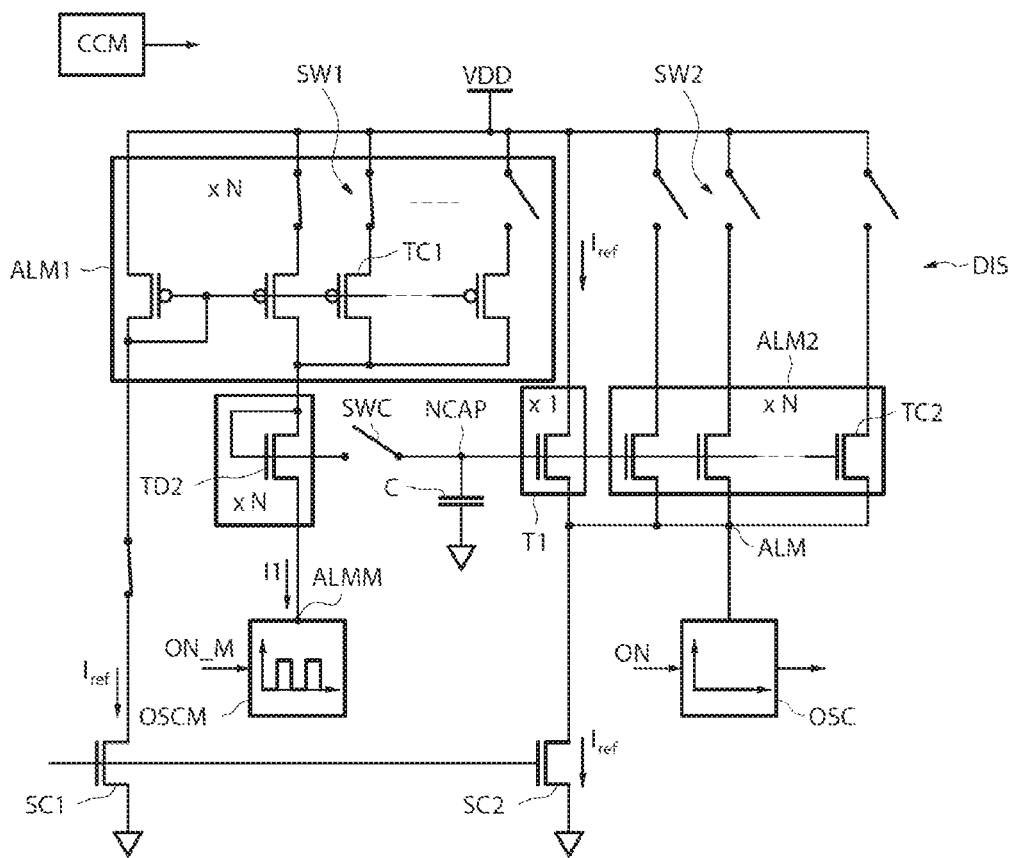
Figure 6:
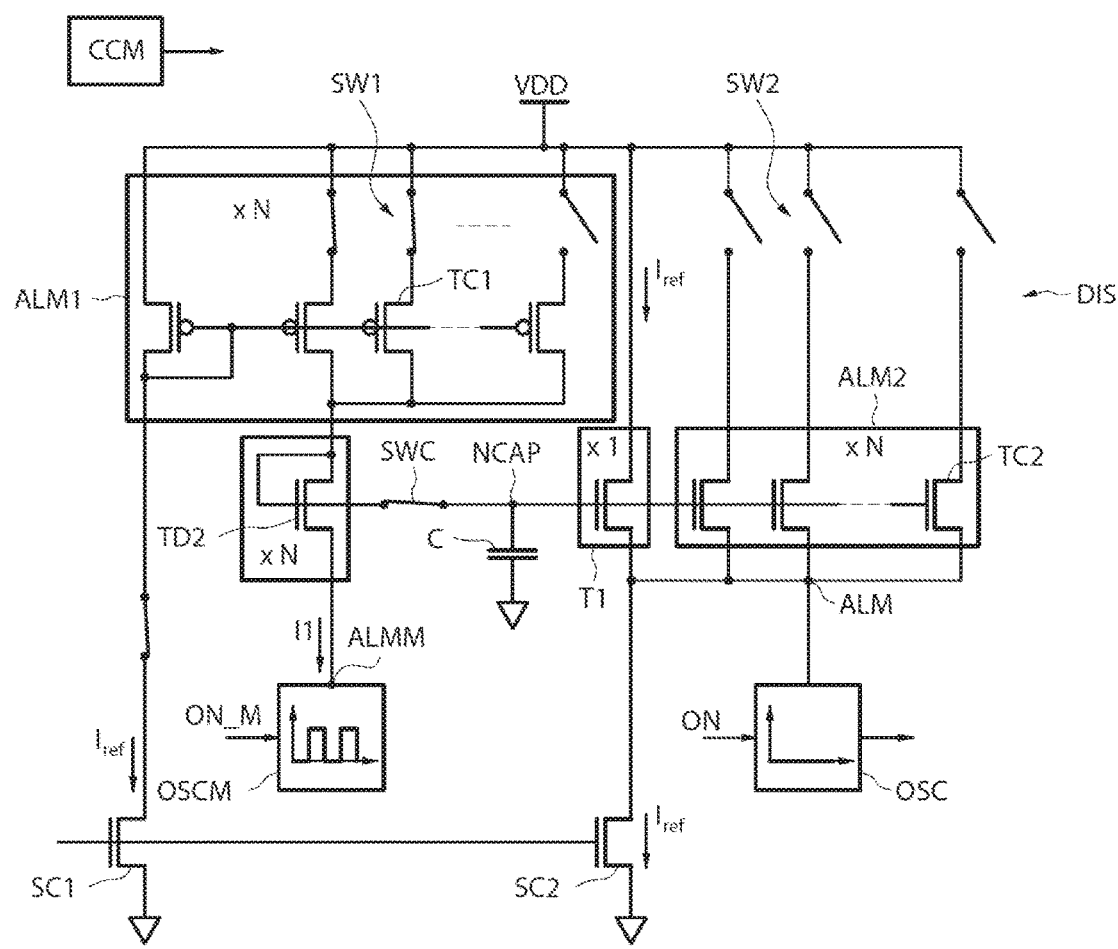

FIGS. 5 and 6 show a refresh of the load voltage to the master load voltage associated with a stable oscillation rate.

In these figures, the second current-generating circuit ALM2 is deactivated, all the second switches SW2 being open.

However, the ring oscillator circuit OSC may or may not be operational (i.e., may or may not be supplied with current by the second current-generating circuit ALM2) during the refresh.

In a manner similar to the initialization step, the master oscillator circuit OSCM is fed by an adjusted current I1, generating a master supply voltage on its supply terminal ALMM.

The load switch SWC remains open until the master oscillator circuit OSCM achieves a stable oscillation rate.

As shown in FIG. 6, when the stable oscillation rate is achieved by the master oscillator circuit OSCM, the switch SWC is closed and the load voltage present on the node NCAP assumes the voltage value present on the anodes of the diode-connected transistors TD2.

The voltage present on the anodes of the diode-connected transistors TD2 corresponds to the voltage controlling the flow of a current providing a stable oscillation rate for the ring oscillator circuit OSC, by the current mirror of the second current-generating circuit.

The load switch SWC is then re-opened, setting the node NCAP to a floating potential having the value of the load voltage.

The second current-generating circuit is thus in a configuration allowing it to generate the current I2 having a value providing a stable oscillation rate for the ring oscillator circuit OSC.

If the refresh is performed during the operating step, the second current-generating circuit ALM2 continues to supply a current I2 providing a stable oscillation rate for the ring oscillator circuit OSC.

If the refresh is performed when the ring oscillator OSC is not in operation, i.e., when all the second power switches SW2 are open, the second current-generating circuit ALM2 is in a configuration ready to supply the ring oscillator circuit OSC with a current I2 providing it immediately with a stable oscillation rate, in response to a next control signal emitted by the control circuit.

Figure 7:
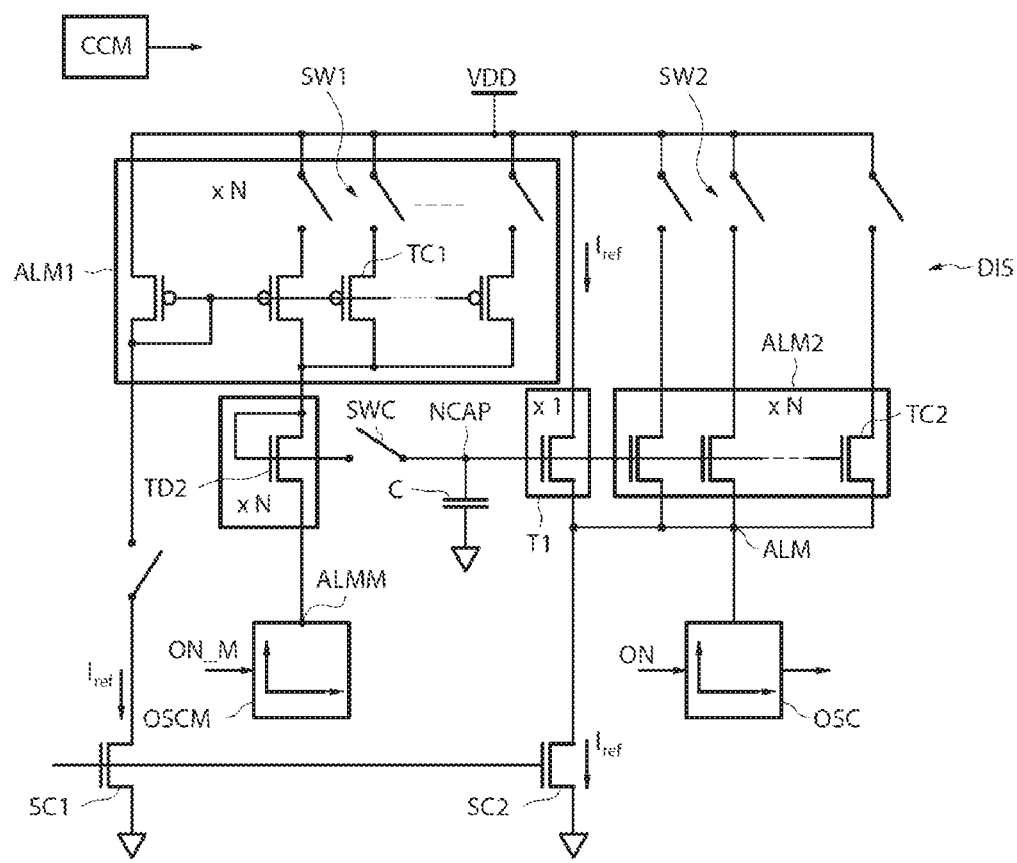

FIG. 7 shows a rest configuration in which the two current-generating circuits ALM1, ALM2 are deactivated, all the power switches SW1, SW2 being open.

When the second current-generating circuit ALM2 is deactivated, a second current source SC2, drawing a reference current Iref on the supply terminal ALM of the ring oscillator circuit OSC allows the potential present on this supply terminal ALM not to be left floating.

Thus, a next supply of the ring oscillator circuit will not be disrupted by a parasitic floating potential on this terminal ALM.

Furthermore, a transistor T1 allows the reference current Iref to flow from the voltage source VDD without disturbing the balance of the circuit of the device DIS, regardless of its implementation step.

The reference current Iref having, for example, an intensity in the region of one hundred nanoamperes, the device DIS for managing the operation of a ring oscillator circuit consumes very little energy at rest, and may restart a stable oscillation rate instantaneously.

The previously described embodiment may obviously be applied to more than one ring oscillator circuit by implementing as many second current-generating circuits as ring oscillator circuits that are to be fed.

What is claimed is:

1. A method for managing operation of a ring oscillator circuit, the method comprising:
   generating a master supply voltage by a master oscillator circuit, the master supply voltage being associated with a stable oscillation rate of the master oscillator circuit, the master oscillator circuit being supplied with current and being structurally identical to the ring oscillator circuit; and
   loading a capacitive circuit with a load voltage originating from the master supply voltage; and
   in response to a control signal, supplying the ring oscillator circuit with a current controlled by a voltage delivered by the capacitive circuit, in such a way as to provide a stable oscillation rate for the ring oscillator circuit.

2. The method according to claim 1, wherein the current supplied to the ring oscillator circuit is controlled by the supply voltage supplied to the master oscillator circuit while the generating and loading steps are being performed.

3. The method according to claim 2, further comprising, during the generating and loading steps until the master supply voltage is reached, adjusting the current supplied to the master oscillator circuit and to the ring oscillator circuit.

4. The method according to claim 1, wherein the generated and loading steps are periodically repeated.

5. The method according to claim 1, wherein the generated and loading steps are periodically repeated when the ring oscillator circuit is in operation.

6. A circuit for managing operation of a ring oscillator circuit, the circuit comprising:
   a master oscillator circuit that is structurally identical to the ring oscillator circuit;
   a first controllable current supply circuit configured to supply a current to the master oscillator circuit;
   a second controllable current supply circuit configured to supply current to the ring oscillator circuit;
   a controllable capacitive circuit having a first configuration in which the controllable capacitive circuit is configured to be loaded at a load voltage originating from a master supply voltage of the master oscillator circuit, the master supply voltage being associated with a stable oscillation rate of the master oscillator circuit, and having a second configuration in which the controllable capacitive circuit is configured to be disconnected from the first controllable current supply circuit and to deliver a voltage; and a controller, configured to manage the operation of a ring oscillator circuit so that during an initialization step, the first controllable current supply circuit is placed in a configuration supplying current to the master oscillator circuit until the master supply voltage is generated and the controllable capacitive circuit is placed in the first configuration; and during an operation mode, the controllable capacitive circuit is placed in the second configuration and the second controllable current supply circuit is placed in a configuration feeding the ring oscillator circuit with a current controlled by the voltage delivered by the controllable capacitive circuit in such a way as to provide a stable oscillation rate for the ring oscillator circuit.

7. The circuit according to claim 6, wherein the controller comprises a control circuit and a load switch controlled by the control circuit;

the controllable capacitive circuit comprises a capacitor connected between a cold point and, via the load switch, an anode of a diode connected to the first controllable current supply circuit; and the control circuit is configured to close the load switch in the initialization step to put the controllable capacitive circuit in the first configuration, and to open the load switch in the operating mode to put the controllable capacitive circuit in the second configuration.

8. The circuit according to claim 7, wherein the controller is configured, during the operation mode, to place the controllable capacitive circuit alternately in the first and second configuration to refresh the load voltage.

9. The circuit according to claim 6, wherein the controller comprises a control circuit and a plurality of first power switches;

the first controllable current supply circuit includes a voltage source and a current-mirror assembly having a plurality of first copy transistors coupled in parallel and configured to copy the same reference current and connected to the voltage source via respective first power switches; and the control circuit is configured so that, during the initialization step, at least some of the first power switches are closed in such a way as to adjust the current feeding the master oscillator circuit.

10. The circuit according to claim 9, wherein the controller further comprises a plurality of second power switches;

the second controllable current supply circuit comprises a voltage source and a current-mirror assembly having a plurality of second copy transistors coupled in parallel, control terminals of the second copy transistors being connected to the controllable capacitive circuit and the second copy transistors being connected to the voltage source via respective second power switches; and the control circuit is configured so that, during the initialization step and until the master supply voltage associated with the stable oscillation rate is reached, at least some of the second power switches are closed in such a way as to adjust the current supplied to the ring oscillator circuit.

11. The circuit according to claim 10, wherein the controller comprises a control circuit and a load switch controlled by the control circuit and wherein the controllable capacitive circuit comprises a capacitor connected between a cold point and, via the load switch, an anode of a diode connected to the first controllable current supply circuit.

12. The circuit according to claim 6, wherein the controller comprises a control circuit and a plurality of second power switches;

the second controllable current supply circuit comprises a voltage source and a current-mirror assembly having a plurality of second copy transistors coupled in parallel, control terminals of the second copy transistors being connected to the controllable capacitive circuit and the second copy transistors being connected to the voltage source via respective second power switches; and the control circuit is configured so that, during the initialization step and until the master supply voltage associated with the stable oscillation rate is reached, at least some of the second power switches are closed in such a way as to adjust the current supplied to the ring oscillator circuit.

13. The circuit according to claim 6, wherein the controller is configured to periodically implement the initialization step.

14. The circuit according to claim 6, wherein the controller is configured to periodically implement the initialization step during the operation mode.

15. A circuit, comprising:

a read amplifier;

a ring oscillator circuit configured to supply the read amplifier with a clock signal;

a master oscillator circuit that is structurally identical to the ring oscillator circuit;

a first controllable current supply circuit configured to supply a current to the master oscillator circuit;

a second controllable current supply circuit configured to supply current to the ring oscillator circuit;

a controllable capacitive circuit having a first configuration in which the controllable capacitive circuit is configured to be loaded at a load voltage originating from a master supply voltage of the master oscillator circuit, the master supply voltage being associated with a stable oscillation rate of the master oscillator circuit, and having a second configuration in which the controllable capacitive circuit is configured to be disconnected from the first controllable current supply circuit and to deliver a voltage; and a controller, configured to manage operation of the ring oscillator circuit so that during an initialization step, the first controllable current supply circuit is placed in a configuration supplying current to the master oscillator circuit until the master supply voltage is generated and the controllable capacitive circuit is placed in the first configuration; and during an operation mode, the controllable capacitive circuit is placed in the second configuration and the second controllable current supply circuit is placed in a configuration feeding the ring oscillator circuit with a current controlled by the voltage delivered by the controllable capacitive circuit in such a way as to provide a stable oscillation rate for the ring oscillator circuit.

16. The circuit according to claim 15, wherein the controller is configured to periodically implement the initialization step during the operation mode.

17. The circuit according to claim 15, wherein
the controller comprises a control circuit and a plurality of first power switches;
the first controllable current supply circuit includes a voltage source and a current-mirror assembly having a plurality of first copy transistors coupled in parallel and configured to copy the same reference current and connected to the voltage source via respective first power switches; and
the control circuit is configured so that, during the initialization step, at least some of the first power switches are closed in such a way as to adjust the current feeding the master oscillator circuit.

18. The circuit according to claim 17, wherein
the controller further comprises a plurality of second power switches;
the second controllable current supply circuit comprises a voltage source and a current-mirror assembly having a plurality of second copy transistors coupled in parallel, control terminals of the second copy transistors being connected to the controllable capacitive circuit and the second copy transistors being connected to the voltage source via respective second power switches; and
the control circuit is configured so that, during the initialization step and until the master supply voltage associated with the stable oscillation rate is reached, at least some of the second power switches are closed in such a way as to adjust the current supplied to the ring oscillator circuit.

19. The circuit according to claim 18, wherein the controller comprises a control circuit and a load switch controlled by the control circuit and wherein the controllable capacitive circuit comprises a capacitor connected between a cold point and, via the load switch, an anode of a diode connected to the first controllable current supply circuit.

20. The circuit according to claim 15, further comprising an array of non-volatile memory cells coupled to the read amplifier.

21. An electronic apparatus, comprising the circuit according to claim 20, the electronic apparatus comprising an on-board computer of a vehicle, a mobile telephone, or a personal computer.

* * * * *